(12) United States Patent
Brintzinger

(10) Patent No.: US 7,514,798 B2
(45) Date of Patent: Apr. 7, 2009

(54) ARRANGEMENT FOR THE PROTECTION OF THREE-DIMENSIONAL STRUCTURES ON WAFERS

(75) Inventor: Axel Brintzinger, Dresden (DE)

(73) Assignee: Infineon Technologies AG, Munich (DE)

( * ) Notice: Subject to any disclaimer, the term of this patent is extended or adjusted under 35 U.S.C. 154(b) by 188 days.

(21) Appl. No.: 10/732,979

(22) Filed: Dec. 11, 2003

(65) Prior Publication Data

US 2004/0135252 A1    Jul. 15, 2004

(30) Foreign Application Priority Data

Dec. 11, 2002    (DE)    ................. 102 58 093

(51) Int. Cl.
*H01L 23/48* (2006.01)
*H01L 23/52* (2006.01)
*H01L 29/40* (2006.01)

(52) U.S. Cl. .................. 257/778; 257/738; 257/786; 257/E23.021; 257/E21.508

(58) Field of Classification Search ........... 257/737, 257/738, 778–781, 730, 786, 773, 731, 733, 257/E23.021, E23.069, E21.508, 736
See application file for complete search history.

(56) References Cited

U.S. PATENT DOCUMENTS

| | | | |
|---|---|---|---|
| 5,666,270 A * | 9/1997 | Matsuda et al. ............. | 361/704 |
| 5,783,465 A | 7/1998 | Canning et al. | |
| 5,828,128 A * | 10/1998 | Higashiguchi et al. ...... | 257/738 |
| 5,985,682 A | 11/1999 | Higgins, III | |
| 6,070,321 A * | 6/2000 | Brofman et al. ............... | 29/840 |
| 6,107,685 A * | 8/2000 | Nishiyama .................. | 257/737 |
| 6,444,489 B1 * | 9/2002 | Lin ........................... | 438/107 |
| 6,664,176 B2 * | 12/2003 | Hedler et al. ............... | 438/614 |
| 6,731,003 B2 * | 5/2004 | Joshi et al. .................. | 257/737 |
| 2002/0121702 A1 | 9/2002 | Higgins, III | |

FOREIGN PATENT DOCUMENTS

| DE | 101 05 351 A 1 | 8/2002 |
|---|---|---|
| DE | 101 36 152 A 1 | 10/2002 |

\* cited by examiner

*Primary Examiner*—Davienne Monbleau
*Assistant Examiner*—DiLinh Nguyen
(74) *Attorney, Agent, or Firm*—Slater & Matsil, L.L.P.

(57) ABSTRACT

An electronic component includes a wafer and a number of bond pads disposed on the wafer. A number of functional 3-D structures are disposed on the wafer. Each functional 3-D structure includes a compliant base element. A number of reroute traces are electrically connected to one of the bond pads and extend onto a surface of one of the functional 3-D structures. A number of selected 3-D structures is disposed on the wafer to provide a mechanical reinforcement. At least some of the selected 3-D structures have a greater mechanical load-bearing capacity than some the functional 3-D structures.

21 Claims, 2 Drawing Sheets

ARRANGEMENT FOR THE PROTECTION OF THREE-DIMENSIONAL STRUCTURES ON WAFERS

TECHNICAL FIELD

The present invention relates generally to electronic components, and more particularly to an arrangement for the protection of three-dimensional structures on wafers.

BACKGROUND

The constantly increasing number of electrical connections between wafers and their carrier elements, and in particular the miniaturization required to obtain flattest possible assemblies, has led to the use of direct electrical bonding of the semiconductor chips on the carrier elements (flip-chip bonding).

However, to permit direct bonding of semiconductor chips on carrier elements, such as a PCB (printed circuit board), it is desirable to produce on the semiconductor chip 3-D structures which end at their respectively highest point in a gold-plated contact area and are connected to the bond pad of the wafer via a reroute trace. This gold-plated contact area may then be provided with a micro-ball, or the like, of a solder material and be electrically and mechanically connected to a corresponding soldering contact on the PCB.

To achieve a certain compensation for mechanical loads of the finished assembly, caused for example by different coefficients of thermal expansion of the individual components, the base element of the 3-D structure is produced from a compliant material, for example silicone, so that after its metallization a three-dimensional, mechanically flexible structure which is firmly connected to the wafer is produced.

The reroute traces used for the electrical connection between the bond pad and the 3-D structure are built up on a seed layer, on which a copper reroute trace is grown and a nickel layer is grown on top. The nickel layer protects the copper layer from corrosion. Under the seed layer and the base element there is generally a dielectric, so that it is ensured that an electrical connection exists only between the contact element on the 3-D structure and the associated bond pad.

To achieve solderability of the contact element, the nickel layer should be coated in this region with gold, at least on the tip of the 3-D structure.

In the case of a method for the structuring of 3-D structures that is currently used in practice, the necessary structuring of the gold layer is realized by a generally known lithographic process. The structuring of the functional elements takes place here by the gold being deposited on the entire redistribution layer following the deposition of the seed layer and the copper/nickel layer. After that, the gold layer is covered by a lithographic process in such a way that selective etching or stripping of the undesired regions of the gold layer can take place and, when completed, a gold layer only remains in the region of the 3-D structure. The 3-D structure produced in this way is to be referred to hereafter as the functional 3-D structure, since it is essential for the electrical bonding of the chips, individually separated from the wafer, with carrier elements.

This method can be summarized by the following process sequence:
depositing of the seed layer;
EPR1 (Epoxy Photoresist 1): coating and structuring (lithographic step 1);
reroute plating, producing the copper/nickel layer on the seed layer;
coating of the reroute trace with gold;
EPR2 (Epoxy Photoresist 2): coating and structuring (lithographic step 2);
selective etching of the gold layer; and
wet etching or stripping.

However, the functional 3-D structures produced by this method must be tested for their functional capability in the wafer assembly, that is before they are separated into individual chips. For this purpose, the wafer must be fed to a testing device in which all the functional 3-D structures can be electrically bonded simultaneously, i.e., so that an electrical contact with a test circuit is established. In this respect it must be ensured that the compliant functional 3-D structures are on the one hand brought into contact with the testing device with adequate force, but on the other hand are not mechanically overloaded or destroyed. It must consequently be ensured that the wafer is placed onto the testing device under defined conditions.

A further problem associated with the use of compliant functional 3-D structures is the quite high sensitivity to damage when they are being handled, e.g., during transport or during intermediate storage.

After the separation of the wafers into individual chips and their soldering to a carrier element, the functional 3-D structures are protected by the carrier element. This means that the sensitive functional 3-D structures primarily have to be protected from damage in the wafer assembly, e.g., before individual separation.

SUMMARY OF THE INVENTION

To solve some of these problems, the present invention provides embodiments that provide an arrangement for the protection of functional 3-D structures on wafers that can be realized in a simple and reliable manner and that ensures reliable protection of the 3-D structures particularly during the handling and testing of the wafers in a testing device. For example, a number of selected 3-D structures on the wafer can be provided with a mechanical reinforcement, so that at least some of these selected 3-D structures have a greater mechanical load-bearing capacity than the other functional 3-D structures.

In this particularly simple way, reliable protection of the functional 3-D structures can be achieved. Furthermore, the mechanically reinforced 3-D structures can be realized without any intervention in the production method described at the background section being necessary.

To achieve the mechanically greater load-bearing capacity, the selected 3-D structures may have a lower degree of compressibility than the other functional 3-D structures. It is also possible without any problem to form the selected 3-D structures in such a way that they have a slightly greater height than the other functional 3-D structures. In both cases the effect is achieved that compressive loading acting on the wafer acts on the selected 3-D structures first and can be absorbed by them within certain limits.

In one embodiment of the invention, the compliant base element of the selected 3-D structures has a significantly greater volume than the other functional 3-D structures, so that a greater height of the selected 3-D structure and/or a lower degree of compressibility compared to the other 3-D functional structures is achieved. Furthermore, the compliant base element of the selected 3-D structure may be protected by a metal cap or by a metallic supporting ring, which surrounds the base element of the selected 3-D structure.

It is expedient to arrange the selected 3-D structures in a regularly distributed manner in the edge region of the wafer, e.g., in such regions that are in any case not used any longer after the individual separation of the wafers. It goes without saying that it is also possible to distribute the selected 3-D structures regularly on the wafer if the way in which the surface area is divided up makes this advisable.

In a special refinement of the invention, the selected 3-D structures are able to be electrically bonded. This allows the placement of the wafer onto a test structure of a testing device to be electrically checked and the simultaneous bonding of all the other functional 3-D structures to be subsequently achieved by a defined force effect.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
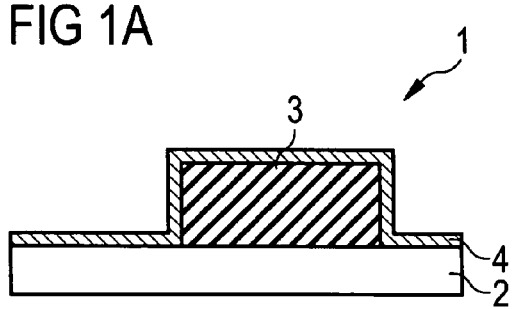
FIG. 1A shows a wafer with a compliant element and a seed layer covering over the structure.
Figure 1B:
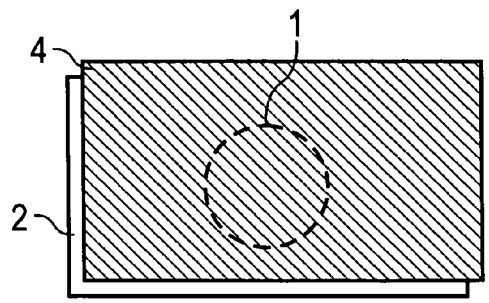
FIG. 1B shows the plan view of the structure according to FIG. 1A.
Figure 2A:
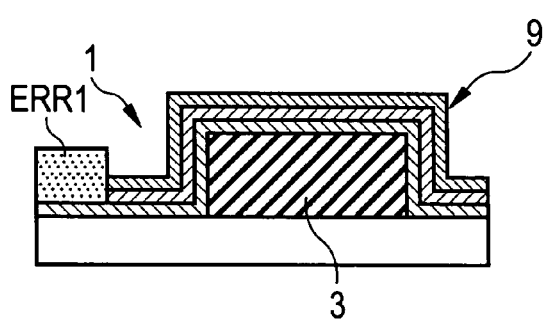
FIG. 2A shows the structure according to FIGS. 1A and 1B after a lithographic step by means of an EPR1 and the deposition of a nickel layer and a copper layer over the compliant element.
Figure 2B:
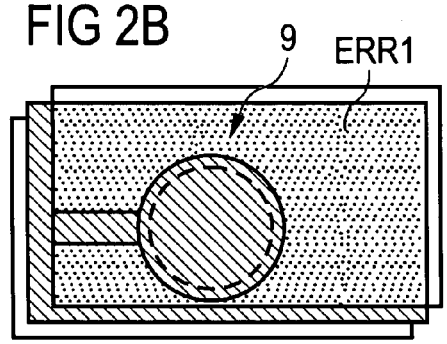
FIG. 2B shows the plan view of the structure according to FIG. 2A.
Figure 3A:
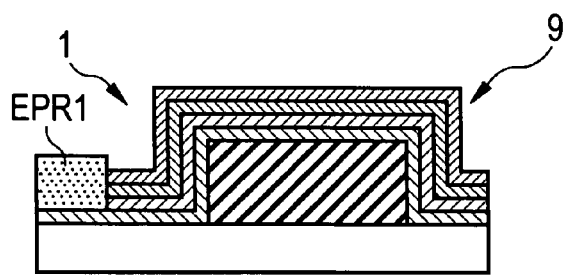
FIG. 3A shows the structure according to FIGS. 2A and 2B after the deposition of a gold layer on the nickel/copper layer.
Figure 3B:
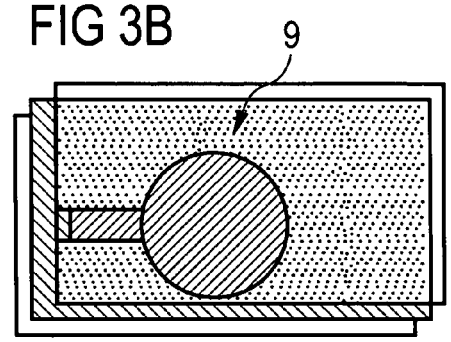
FIG. 3B shows a plan view of the structure according to FIG. 3A.
Figure 4A:
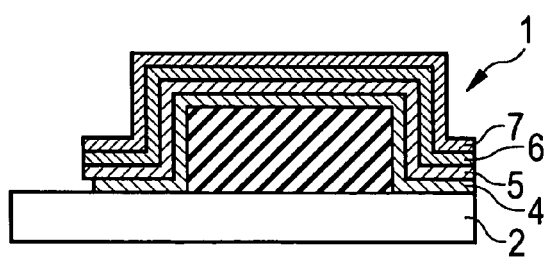
FIG. 4A shows the finished 3-D structure, reinforced with a metal cap after the stripping of the EPR1 and the etching of the seed layer.
Figure 4B:
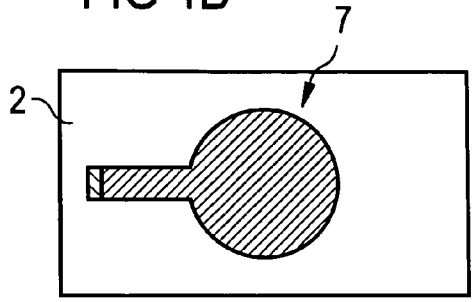
FIG. 4B shows a plan view of the 3-D structure according to FIG. 4A.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A preferred embodiment of this invention relates to an arrangement for the protection of 3-D structures on wafers. For example, these 3-D structures can be contact structures in the form of flexible or compliant bumps that are electrically connected to a bond pad on the wafer via a reroute trace (reroute layer). The reroute trace can extend onto the functional 3-D structure and comprises a copper/nickel layer, which is covered by a gold layer.

The present invention will be now described with respect to preferred embodiments in a specific context, namely a semiconductor wafer. The invention may also be applied, however, to other electronic and/or optical components that can be interconnected by use of three-dimensional contacts.

FIGS. 1A-4B show the production sequence of a selected 3-D structure 1 according to one embodiment of the invention, which is formed on a wafer 2. The completed selected 3-D structure 1 comprises a compliant base element 3, for example of silicone, on which there has firstly been applied a seed layer 4, which has then been covered by a nickel layer 5 and a copper layer 6. Finally, on the copper layer 6 there is also a gold layer 7. Although this gold layer 7 is not essential for the function of the selected 3-D structure, it is produced concomitantly in the production of the functional 3-D structures 8 (illustrated in FIGS. 6 and 7).

In other embodiments, other conductors can be used in place of the multilayer conductor 4/5/6/7. For example, the conductors can be made from aluminum, copper, tungsten, or other conductors. The conductor can comprise a single layer or, as illustrated, multiple layers. While shown with four layers, it is understood that more or fewer layers can be used.

In a preferred embodiment, the selected 3-D structures 1 and functional 3-D structures (not shown in FIGS. 1-4; see FIG. 7) are produced simultaneously. The only difference is that compliant elements 3 of greater dimensions are applied on the wafer 2 for the selected 3-D structures 1 and that the photoresist EPR1 is structured in such a way that the entire upper surface area of the selected 3-D structure 1 is kept free, and consequently a cap-like structure is produced during the metallization. By contrast with this, the functional 3-D structures 8 are electrically connected to a bond pad 11 via a metal reroute trace (reroute layer), in that the reroute layer 9 extends up to the tip of the functional 3-D structure 8 (see e.g., FIG. 7).

The preferred method for the production of the selected 3-D structures 1 and the functional 3-D structures 8 can be represented in a simplified form as follows:

a: depositing of the seed layer 4;

b: coating and structuring of the photoresist, e.g., epoxy photoresist (lithographic step 1 or EPR1);

c: reroute plating, producing the copper/nickel layer 6/5 on the seed layer 4;

d: coating of the reroute trace with gold 7;

e: coating and structuring of photoresist, e.g., epoxy photoresist (lithographic step 2 or EPR1);

f: selective etching of the gold layer 7; and g: wet etching or stripping.

With the steps a-d, cap-like structures are created on all the 3-D structures 1 and 8. The subsequent steps e and f serve for the structuring of the reroute layer 9 (metal reroute trace) on the functional 3-D structures.

Figure 5A:
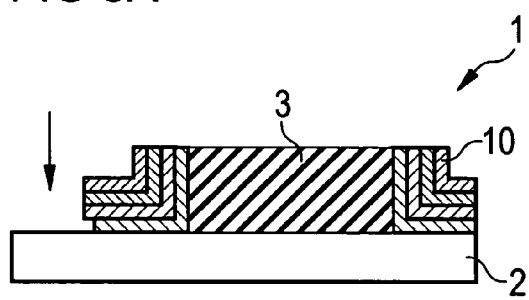
FIG. 5A shows the finished 3-D structure, reinforced with a metal ring, after the stripping of the EPR1 and the etching of the seed layer.
Figure 5B:
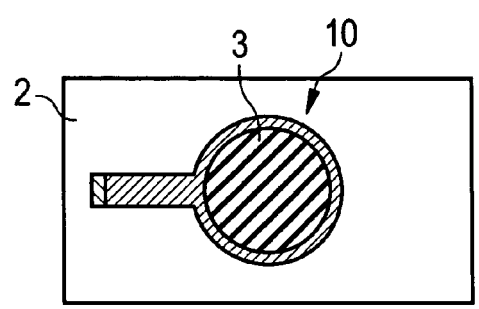
FIG. 5B shows the plan view of the 3-D structure according to FIG. 5A.

The production of the metallic supporting ring 10 for the protection of the selected 3-D structure 1 can be performed with the same method steps a-d (see e.g., FIGS. 5A and 5B). The only difference here is that the tip of the compliant element 3 is covered by a resist during the execution of these process steps, so that no metal is deposited on the compliant element 3. After the stripping of the resist and the etching of the seed layer 4, the metallic supporting ring 10 that can be seen from FIGS. 5A and 5B then remains.

Figure 6:
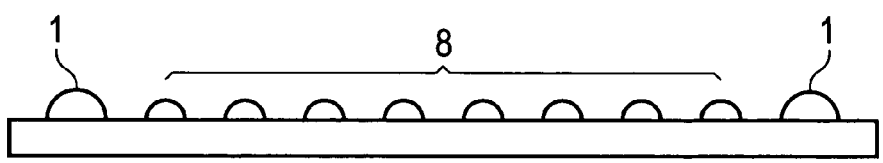
FIG. 6 shows a schematic sectional representation of a wafer with reinforced 3-D structures and functional 3-D structures.
Figure 7:
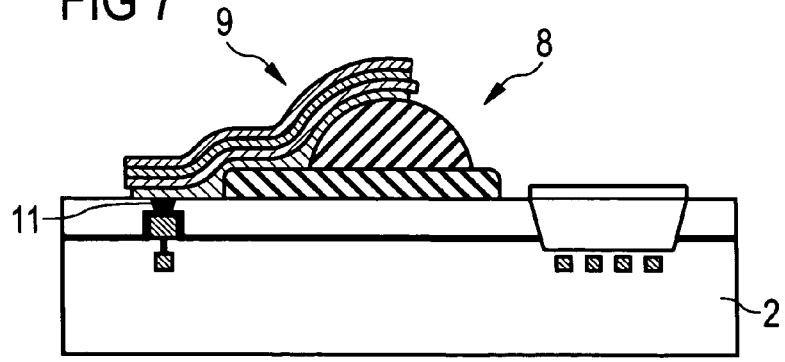
FIG. 7 shows an example of the construction of a functional 3-D structure.

FIG. 6 finally also shows a schematic sectional representation of a wafer 2 with reinforced selected 3-D structures 1 and functional 3-D structures 8. It is clearly evident from this representation that, when the wafer 2 is placed onto a planar base, the selected 3-D structures 1 come into contact first with the surface of the base. The functional 3-D structures 8 are completely protected here from damage, for example if the wafer 2 is displaced on the base.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electronic component comprising:
   a wafer;
   a plurality of bond pads disposed on a surface of the wafer;
   a plurality of functional 3-D structures disposed on the surface of the wafer, such that each bond pad is laterally spaced from the plurality of bond pads so that each bond pad is associated with a laterally-spaced one of the 3-D structures, each functional 3-D structure including a non-conductive compliant base element and having an upper surface spaced from the surface of the wafer;
   a plurality of reroute traces, each reroute trace extending over the surface of the wafer between a bond pad and its associated 3-D structure such that each reroute trace is electrically connected to one of the bond pads and extends onto the upper surface of the associated laterally-spaced one of the functional 3-D structures so that the reroute trace provides an electrical connection between the bond pad and the upper surface of the associated functional 3-D structure; and
   a plurality of selected 3-D structures disposed on the surface of the wafer to provide a mechanical reinforcement, wherein at least some of the selected 3-D structures have a greater mechanical load-bearing capacity than some of the functional 3-D structures.

2. The component of claim 1 wherein each reroute trace comprises a copper/nickel layer that is covered by a gold layer.

3. The component of claim 1 wherein the selected 3-D structures have a lower degree of compressibility than the functional 3-D structures.

4. The component of claim 1 wherein the selected 3-D structures have a greater height than the functional 3-D structures.

5. The component of claim 1 wherein each of the selected 3-D structures includes a compliant base element that has a greater volume than the compliant base element of the functional 3-D structures.

6. The component of claim 1 wherein the selected 3-D structures are arranged in a regularly distributed manner in an edge region of the wafer.

7. The component of claim 1 wherein the selected 3-D structures are arranged in a regularly distributed manner over the wafer.

8. The component of claim 1 wherein the selected 3-D structures are able to be electrically bonded.

9. The electronic component of claim 1, wherein the compliant base element is formed from silicone.

10. The component of claim 1 wherein each of the selected 3-D structures is protected by a metal cap.

11. The component of claim 1 wherein each of the selected 3-D structures is surrounded by a metallic supporting ring.

12. The component of claim 1 wherein each of the other 3-D structures have a support structure formed upon a surface of the 3-D structure.

13. The component of claim 12 wherein the support structure comprises a metal cap disposed over an entire upper surface of the other 3-D structures.

14. The component of claim 12 wherein the support structure comprises a metal ring formed along side surfaces of the other 3-D structures.

15. The component of claim 14 wherein the metal ring is not disposed on any portion of an upper surface of the other 3-D structures.

16. The component of claim 12 wherein the support structure is formed from the same material as the reroute traces.

17. The component of claim 12 wherein each reroute trace comprises a copper/nickel layer that is covered by a gold layer.

18. The component of claim 12 wherein the other 3-D structures have a lower degree of compressibility than the functional 3-D structures.

19. The component of claim 12 wherein the other 3-D structures have a greater height than the functional 3-D structures.

20. The component of claim 12 wherein each of the other 3-D structures includes a compliant base element that has a greater volume than the compliant base element of the functional 3-D structures.

21. The component of claim 12 wherein the other 3-D structures are arranged in a regularly distributed manner in an edge region of the wafer.

\* \* \* \* \*